(12) United States Patent
Hayashi et al.

(10) Patent No.: US 6,448,190 B1
(45) Date of Patent: Sep. 10, 2002

(54) METHOD AND APPARATUS FOR FABRICATION OF INTEGRATED CIRCUIT BY SELECTIVE DEPOSITION OF PRECURSOR LIQUID

(75) Inventors: Shinichiro Hayashi, Osaka (JP); Larry D. McMillan; Carlos A. Paz de Araujo, both of Colorado Springs, CO (US)

(73) Assignees: Symetrix Corporation, Colorado Springs, CO (US); Matsushita Electric Industrial Co., Ltd., Colorado Springs, CO (US)

( * ) Notice: Subject to any disclaimer, the term of this patent is extended or adjusted under 35 U.S.C. 154(b) by 0 days.

(21) Appl. No.: 09/316,917

(22) Filed: May 21, 1999

(51) Int. Cl.$^7$ .............................................. H01L 21/00
(52) U.S. Cl. ...................... 438/778; 438/239; 438/240; 438/241; 438/758; 438/782; 438/3
(58) Field of Search ........................... 438/3, 239, 241, 438/240

(56) References Cited

U.S. PATENT DOCUMENTS

| | | | |
|---|---|---|---|
| 3,895,127 A | | 7/1975 | Comizzoli |
| 5,435,887 A | * | 7/1995 | Rothschild et al. ............ 216/26 |
| 5,456,945 A | | 10/1995 | McMillan et al. |
| 5,466,630 A | * | 11/1995 | Lur ............................. 438/407 |
| 5,614,018 A | | 3/1997 | Azuma et al. |
| 5,789,303 A | | 8/1998 | Leung et al. |
| 5,843,516 A | | 12/1998 | Derbenwick et al. |
| 5,891,528 A | | 4/1999 | Turek et al. |

FOREIGN PATENT DOCUMENTS

| | | |
|---|---|---|
| EP | 0 788 149 A1 | 8/1997 |
| JP | 04037133 | 2/1992 |
| JP | 04186831 | 7/1992 |
| JP | 07045528 | 2/1995 |
| WO | WO97/44818 | 11/1997 |

OTHER PUBLICATIONS

Homma et al., "A Selective SiO2 Film–Formation Technology Using Liquid–Phase Deposition for Fully Planarized Multilevel Interconnections," J. Electrochem. Soc., vol. 140, No. 8, Aug. 1993, pp. 2410–2414.*

Hayashi et al., "Gigabit–Scale DRAM Capacitor Technology with High Dielectric Constant Thin Films bu A Novel Conformal Deposition Technique," 1994 Symposium on VLSI Technology Digest of Technical Papers, IEEE, p. 153–154 (Jun. 7, 1994).

Tokyuama et al., "VLSI Fabrication Technology," How to make ILD with compressive stress, 1st ed., Nikkei BP (Japan), p. 154–157 (Jun. 1, 1989).

* cited by examiner

Primary Examiner—Carl Whitehead, Jr.
Assistant Examiner—Jeff Vockrodt
(74) Attorney, Agent, or Firm—Patton Boggs LLP

(57) ABSTRACT

A thin film of solid material is selectively formed during fabrication of an integrated circuit by applying a liquid precursor to a substrate having a first surface and a second surface and treating the liquid precursor. The first surface has different physical properties than the second surface such that a solid thin film forms on the first surface but does not form on the second surface. The substrate is washed after formation of said solid thin film to remove any residues of said liquid from the second substrate surface.

36 Claims, 3 Drawing Sheets

METHOD AND APPARATUS FOR FABRICATION OF INTEGRATED CIRCUIT BY SELECTIVE DEPOSITION OF PRECURSOR LIQUID

BACKGROUND OF THE INVENTION

1. Field of the Invention

The invention relates to methods of fabricating integrated circuits, and more particularly to a method of improving the formation of a thin film of solid material during the fabrication of integrated circuits by selective deposition of a precursor liquid on a surface having nonuniform surface properties.

2. Statement of the Problem

The manufacture of integrated circuits entails series of numerous steps in which layers of materials are sequentially deposited, patterned, and etched to form the various components of the circuit.

One of the problems associated with integrated circuit manufacture is that thin film layers, once deposited, must usually be patterned and etched using complex, multistep processes. The patterning and etching processes are time-consuming and expensive; furthermore, the etching mechanisms to remove certain layers often cannot be exactly controlled, resulting in damage to the integrated circuit and in decreased manufacturing yields.

3. Solution to the Problem

The invention solves the problems associated with patterning and etching processes by providing a method for selectively depositing a thin film of solid material on an integrated circuit substrate. According to the method of the invention, a thin film of solid material is formed only on a selected portion of the substrate. As a result, no patterning and etching of the thin film is necessary to remove it from unselected portions.

The thin film of solid material is selectively formed on only a selected portion of the substrate, and is not formed on another portion of the substrate, by selecting the substrate portions so that they are different in at least one physical property, and selecting the deposition process so that the thin film will form on the portion of the substrate with a selected physical property and will not form on the portion of the substrate having the different physical property.

In a preferred embodiment, the method of the invention comprises: providing a substrate having a substrate surface, such that the substrate surface has a first substrate surface and a second substrate surface; providing a precursor liquid for forming a liquid coating on the substrate surface such that the liquid coating will have a surface tension suitable for wetting the first substrate surface and unsuitable for wetting the second substrate surface; applying the precursor liquid to the substrate surface to form the liquid coating; and treating the liquid coating on the substrate surface to form the thin film of solid material on the first substrate surface.

The invention provides a method of fabricating a thin film of solid material in an integrated circuit, comprising steps of: providing a substrate having a first substrate surface and a second substrate surface, the first substrate surface having at least one physical property that is different than the corresponding physical property of the second substrate surface; selecting a precursor liquid and a precursor liquid deposition process such that applying the precursor liquid to the first and second substrates using the liquid deposition process will form a solid thin film on the first substrate surface upon treating of the liquid precursor and will not form a solid thin film on the second substrate surface upon treating of the liquid precursor; applying the precursor liquid to the substrate using the liquid deposition process to coat the substrate; and treating the coating on the substrate to form the thin film of solid material on the first substrate surface. Preferably, the method further includes the step of cleaning the substrate to remove residues from the second substrate surface without removing the thin film of solid material from the first substrate surface. Preferably, the step of cleaning comprises washing the substrate. Preferably, the step of selecting a precursor liquid comprises selecting a precursor liquid that will more readily wet the first surface than the second surface. Preferably, the step of selecting a precursor liquid comprises selecting a precursor liquid including a solvent selected from the group comprising HMDS and dioxane. Preferably, the step of selecting a precursor deposition process comprises selecting a process from the group comprising spin coating and misted deposition. Preferably, the step of selecting a precursor deposition process comprises selecting a misted deposition process and further includes the step of selecting a range of droplet sizes for the mist such that the droplets will more readily stick to the first surface than the second surface. Preferably, the step of selecting a precursor deposition process comprises selecting a misted deposition process and further includes the step of selecting a deposition rate such that a solid thin film will be formed on the first surface and a solid film will not be formed on the second surface. Preferably, the first surface comprises a conductive material and the second surface comprises an insulating material. Preferably, the conductive material is selected from the group consisting of platinum, iridium, ruthenium, palladum, tungsten, titanium tungsten, metal silicides, tantalum nitride, aluminum titanium nitride, and titanium nitride. Preferably, the insulating material is selected from the group consisting of silicon oxides, silicon nitrides, silicon oxynitrides and silicon oxyfluorides. Preferably, the first surface comprises a material having tensile stress and the second surface comprises a material having compressive stress. Preferably, the step of treating comprises a process selected from the group consisting of: exposing to vacuum, exposing to ultraviolet radiation, electrical poling, drying, heating, baking, rapid thermal processing, and annealing.

In another aspect, the invention provides a method of fabricating a thin film of solid material in an integrated circuit, comprising steps of: providing a substrate having a first substrate surface and a second substrate surface, the first substrate surface being a surface on which a thin film of a solid material will tend to form upon application of a precursor liquid to the first substrate surface and treating of the precursor liquid, and the second substrate surface being a surface on which a thin film of a solid material will tend not to form upon application of the precursor liquid to the second substrate surface and the treating of the precursor liquid; applying the precursor liquid to the substrate; and treating the precursor liquid on the substrate to form the thin film of solid material on the first substrate surface. Preferably, the method further includes the step of cleaning the substrate to remove residues from the second substrate without removing the thin film of solid material from the second substrate. Preferably, the step of cleaning comprises washing the substrate. Preferably, the precursor liquid is selected from the group consisting of HMDS and dioxane. Preferably, the first surface comprises a conductive material and the second surface comprises an insulating material. Preferably, the conductive material is selected from the group consisting of platinum, iridium, ruthenium, palladum, tungsten, titanium tungsten, metal silicides, tantalum nitride, aluminum titanium nitride, and titanium nitride. Preferably, the insulating material is selected from the group consisting of silicon oxides, silicon nitrides, silicon oxynitrides and silicon oxyfluorides. Preferably, the first surface comprises a material having tensile stress and the second surface comprises a material having compressive stress. Preferably, the step of applying is selected from the group consisting of spin coating and misted deposition. Preferably, the step of treating comprises a process selected from the group consisting of: exposing to vacuum, exposing to ultraviolet radiation, electrical poling, drying, heating, baking, rapid thermal processing, and annealing.

In a further aspect, the invention provides a method of fabricating a thin film of solid material in an integrated circuit, comprising steps of: providing a substrate having a substrate surface, the substrate surface having a wetting portion and a nonwetting portion; providing a precursor liquid for forming a liquid coating on the substrate surface such that the liquid coating will have a surface tension suitable for wetting the wetting portion and unsuitable for wetting the nonwetting portion; applying the precursor liquid to the substrate surface to form the liquid coating; and treating the liquid coating on the substrate surface to form the thin film of solid material on the wetting portion. Preferably, the thin film of solid material comprises a metal oxide, and most preferably, a layered superlattice material or silicon dioxide. Preferably, the precursor liquid comprises a metal compound, and preferably, the metal compound is selected from the group consisting of metal 2-ethylhexanoates and metal 2-methoxyethoxides, and the solvent is selected from the group consisting of alcohols, aromatic hydrocarbons, and esters. Preferably, the method further comprises a step of washing the substrate surface to remove undesired material from the nonwetting portion.

In yet a further aspect, the invention provides an integrated circuit comprising: a first layer comprising a first material having a first surface; a second layer comprising a second material, having a second surface; a third layer comprising a third material formed over the second layer; the first, second and third layers meeting at a junction region; and the first surface having a first portion adjacent to and on one side of the junction region, a second portion adjacent to and on the other side of the junction region from the first portion, the first and second portions of the first surface being level with one another. Preferably, the third layer is formed directly on the second layer.

The method according to the invention not only permits the reduction in the number of process steps needed to fabricate an integrated circuit, but also results in high quality thin films that are useful for sensitive integrated circuit applications. Numerous other features, objects and advantages of the invention will become apparent from the following description when read in conjunction with the accompanying drawings.

DETAILED DESCRIPTION OF THE PREFERRED EMBODIMENT

It should be understood that the FIGS. 1–6 and 9 depicting integrated circuit devices are not meant to be actual plan or cross-sectional views of any particular portion of an actual integrated circuit device. In the actual devices, the layers will not be as regular and their thicknesses may have different proportions. The various layers in actual devices often are curved and possess overlapping edges. The figures instead show idealized representations which are employed to depict more clearly and fully the method of the invention than would otherwise be possible. Also, the figures represent only one of innumerable variations of devices that could be fabricated using the method of the invention.

Figure 1:
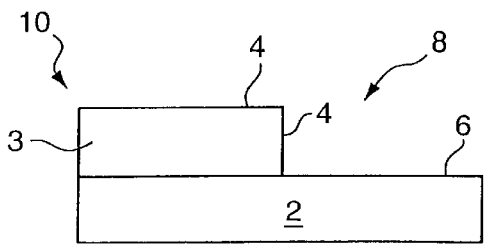
FIG. 1 depicts an intermediate stage in the fabrication of a section of an integrated circuit comprising a layer 2 on which a layer 3 has been deposited, patterned, and etched, and in which a substrate includes the exposed portions of layer 2 and layer 3.

FIG. 1 depicts a partially completed integrated circuit substrate 8 representing an intermediate stage in the fabrication of a section of an integrated circuit 10 comprising a layer 2 on which a layer 3 has been deposited, patterned, and etched. A first substrate surface 4 of layer 3 and a second substrate surface 6, which is a portion of the surface 17 of layer 2 (FIG. 6), together form the substrate 8. According to the invention, at least one property of surface 4 is different than a property of surface 6, so that, upon deposition of a precursor, in liquid, mist, or gaseous vapor form, a solid thin film will be formed on one surface but will not be formed on the other surface.

In a first embodiment of the invention, the substrate surface 4 has a different surface tension than the substrate surface 6. Generally, a liquid tends to wet a solid surface well when the solid-liquid interface has a surface tension, $\gamma_{sl}$, less than the solid-vapor surface tension, $\gamma_{sv}$. In such a case, it is energetically more favorable for the solid surface to be covered by the liquid than to be exposed to the vapor.

Conversely, a liquid on a particular solid surface tends to be nonwetting when the solid-vapor surface tension, $\gamma_{sv}$, is less than the solid-liquid surface tension, $\gamma_{sl}$. In such a case, it is energetically more favorable for the solid surface to have an interface with the vapor than with the liquid. The present invention uses the phenomenon of the influence of relative surface tensions on the wetting properties of a liquid precursor to achieve selective application of the liquid precursor on an integrated circuit substrate and, thereby, to achieve selective deposition of a thin film of solid material on the substrate.

In accordance with this first embodiment of the invention, the solid-vapor surface tension, $\gamma_{sv,4}$, of layer 3 is selected such that first substrate surface 4 is a wetting portion 4 of substrate 8; in contrast, the solid-vapor surface tension, $\gamma_{sv,6}$, of layer 2 was selected such that second substrate surface 6 is a nonwetting portion 6 of substrate 8. Generally, if the solid-liquid surface tension, $\gamma_{sl,4}$, between the liquid precursor and first substrate surface 4 is low compared to the solid-vapor surface tension, $\gamma_{sv,4}$ of first substrate surface 4, then the liquid precursor tends to wet the surface of first substrate surface 4 to decrease the surface tension of first substrate surface 4. Conversely, if the solid-liquid surface tension, $\gamma_{sl,6}$, between the liquid precursor and second substrate surface 6 is high compared to the solid-vapor surface tension, $\gamma_{sv,6}$ of second substrate surface 6, then it is energetically more favorable if the liquid precursor does not wet the surface of second substrate surface 6. In such a case, the liquid precursor does not tend to wet the surface of second substrate surface 6. As a result, the liquid precursor forms clumps of liquid, minimizing the areas of interface between second substrate surface 6 and the liquid precursor.

Figure 2:
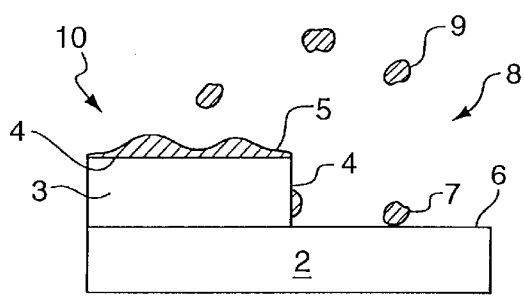
FIG. 2 depicts a further intermediate stage in the fabrication of the section depicted in FIG. 1 in which liquid mist droplets of a liquid precursor for a desired thin film of solid material are being applied to the substrate and are selectively wetting the substrate.

A liquid precursor may be applied using a spin-on method or a misted deposition method, as described in U.S. Pat. No. 5,614,252, issued Mar. 25, 1997 to McMillan et al. Preferably, a misted deposition method is used. FIG. 2 depicts a further intermediate stage in the fabrication of the section depicted in FIG. 1. In FIG. 2, a liquid precursor for a desired thin film of solid material is being applied to substrate 8 by a misted deposition process. Liquid mist droplets of liquid precursor collapse and gradually wet first substrate surface 4 because solid-liquid surface tension, $\gamma_{sl,4}$, between the liquid precursor and first substrate surface 4 is low compared to the solid-vapor surface tension, $\gamma_{sv,4}$ of first substrate surface 4. The angle formed between the liquid and first substrate surface 4 is low, resulting in a pronounced antimeniscus 5. In contrast, a liquid mist droplet on second substrate surface 6 does not wet second substrate surface 6 well; instead, the liquid forms a strong convex meniscus 7 and stays in a clump on the surface because it is energetically unfavorable for the liquid to spread out and wet the surface. As discussed above, one factor that leads to this result is if the solid-liquid surface tension, $\gamma_{sl,6}$, between the liquid precursor and second substrate surface 6 is high compared to the solid-vapor surface tension, $\gamma_{sv,6}$ of second substrate surface 6. That is, as a result of the high surface tension between the liquid and second substrate surface 6, the liquid builds a high angle to the surface, exhibiting the pronounced meniscus on the surface.

Figure 3:
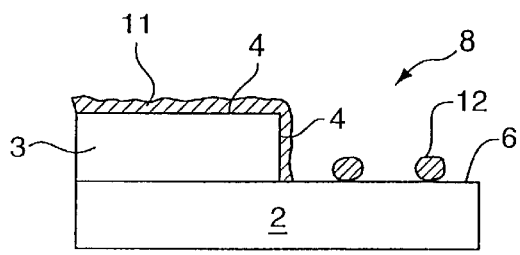
FIG. 3 depicts a further intermediate stage in the fabrication of the section depicted in FIG. 2 in which a liquid precursor for a desired thin film of solid material has selectively wetted the substrate.

FIG. 3 depicts a further intermediate stage in the fabrication of the section depicted in FIG. 1. A liquid precursor has formed a continuous liquid coating 11 on first substrate surface 4 of substrate 8. In contrast, the liquid precursor is present on second substrate surface 6 of substrate 8 in a nonwetting, discontinuous pattern 12.

Figure 4:
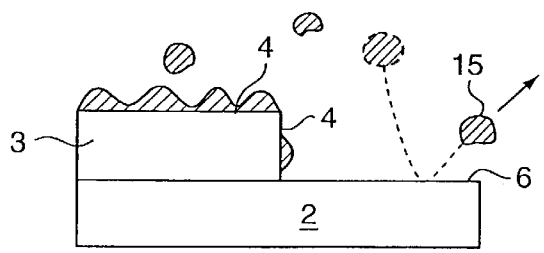
FIG. 4 depicts an alternative embodiment of the invention showing a further intermediate stage in the fabrication of the section depicted in FIG. 1.
Figure 5:
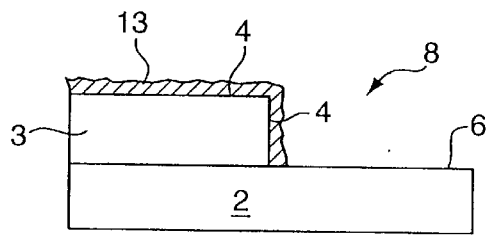
FIG. 5 depicts a further intermediate fabrication stage of the section shown in FIG. 4.

Another example of the selective deposition method of the invention is depicted in FIG. 4, in which liquid mist particles of liquid precursor strike and wet first substrate surface 4, but bounce off second substrate surface 6. For example, during misted deposition processes, mist particles having certain particle size, mass and surface tension are directed with some velocity towards partially completed integrated circuit substrate 8. Depending on the relative properties of the two surfaces 4 and 6, mist particles of a selected particle size range may deposit on first substrate surface 4 and wet it, while mist particles, such as 15, bounce off of second substrate surface 6, leaving it virtually free of liquid precursor. As a result, as depicted in FIG. 5, first substrate surface 4 becomes wetted with a liquid coating of liquid precursor, and second substrate surface 6 remains virtually free of liquid precursor. A selective liquid coating as in FIG. 5 also occurs when second substrate surface 6 repels liquid precursor as it is being applied to substrate 8, during a spin-on process or other liquid deposition process.

The relative properties of the two surfaces that cause the mist particles to wet surface 4 but bounce off of surface 6 may include the relative surface tensions discussed above. Another property that is also effective in this respect is the relative electrical potential of the two surfaces 4 and 6. In one embodiment, the particles 9 are charged and integrated circuit 10 is either charged or grounded. If layer 2 is an insulator and layer 3 is a conductor, different potentials will develop on surfaces 4 and 6 which affect the particles 9 differently. In one embodiment, particles 9 are charged, either positively or negatively, and integrated circuit 10 is grounded. Since layer 3 is a conductor, any charge that develops on surface 4 will be rapidly neutralized. However, since layer 2 is an insulator, a charge will build up on it that tends to repel particles 9 to a greater degree than does layer 3. Thus, a liquid layer will form on surface 4 but not on surface 6. Alternatively, a charge that is opposite to that of charged particles 9 may be placed on integrated circuit 10 with similar results. Or a charge that is the same as that of charged particles 9 may be placed on integrated circuit 10, with the result that a liquid layer will form on surface 6 but not on surface 4. Or particles 9 may not be charged but the integrated circuit charged, which induces a charge on the particles 9 that causes them to be attracted to or repelled from one of surfaces 4 and 6 and not the other.

Another physical property that can cause a precursor to form a film on one surface 4 but not on the other surface 6 is the surface structure. For example, a surface that is sputtered will have a different structure than a surface that is thermally oxidized. Or, a surface that is wet-etched will have a different surface structure than a surface that is finished by chemical mechanical polishing (CMP). A smooth structure can be difficult to wet as compared to a rougher structure. The different surface structures can also be utilized to selectively form films on one surface but not on another.

Figure 6:
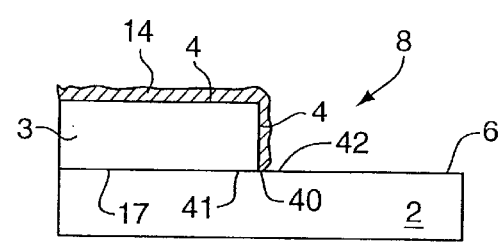
FIG. 6 depicts a further intermediate stage in the fabrication of either the sections depicted in FIGS. 2 and 3, or the sections depicted in FIGS. 4 and 5 in which a thin film of solid material covering a selected portion of the substrate was formed by treating the liquid coating of FIGS. 3 or 5.

FIG. 6 depicts a further intermediate stage in the fabrication of the sections depicted in FIGS. 2–5. FIG. 6 shows a thin film 14 of solid material formed by treating the liquid coating 11, 13 of either FIG. 3 or FIG. 5. Thin film 14 is a continuous solid layer covering first substrate surface 4 of substrate 8, but thin film 14 is not present on second substrate surface 6 of substrate 8. This is the result of one of several causes. If the liquid precursor was not present on second substrate surface 6 at the time of treating, as depicted in FIG. 5, then portion 6 remains free of the solid material formed in thin film 14. Or, even if some liquid precursor 12 was present on second substrate surface 6, as depicted in FIG. 3, it does not form a stable solid material that adheres well to portion 6. As indicated above, one cause of this result is that the relative surface tensions $\gamma_{sv,6}$ and $\gamma_{sl,6}$ favor formation of a wetted surface on surface 4 but do not favor the wetting of surface 6. However, even if the surface tensions $\gamma_{sv,6}$ and $\gamma_{sl,6}$ energetically favor wetting of portion 6 under the conditions for applying the liquid coating, the composition of the liquid precursor may be designed so that surface tension values change during the treating steps. For example, the solid-liquid surface tension may be low enough, compared to the solid-vapor surface tension of portion 6, to allow wetting of second substrate surface 6. The precursor liquid, however, comprises solvents and other compounds that are not present after treating. As the composition of the liquid coating changes during treating, it may become energetically unfavorable for the treated coating to cover portion 6 and, as a result, a stable, well adhering thin film cannot form on portion 6. As a result, any undesired solid material formed on second substrate surface 6 washes off during standard cleaning steps in conventional fabrication processes, leaving an integrated circuit section as depicted in FIG. 6, in which thin film 14 covers first substrate surface 4, but not second substrate surface 6.

In the completed integrated circuit, layers 2, 3, and 14 meet at a junction region 40 (FIG. 6). A first portion 41 of the surface 17 of layer 2 is adjacent to and on one side of the junction region 40, and a second portion 42 of the surface 17 of layer 2 is adjacent to and on the other side of junction region 40. It is a feature of the invention that the first portion 41, the second portion 42 are level with each other; that is surface 17 is continuously flat and level through and on either side of the junction region 40. This simplifies formation of the integrated circuit because the steps formed in the prior art processes (see FIG. 8 and the discussion below) must be accounted for in subsequent processing.

Figure 7:
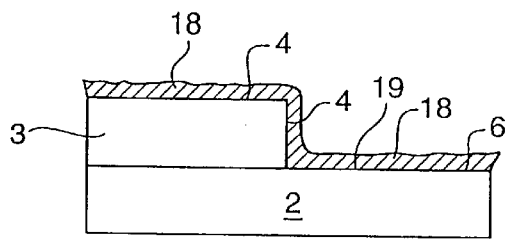
FIG. 7 depicts an intermediate stage of an integrated circuit section fabricated using a conventional method of the prior art in which a thin film 18 of solid material completely covers the underlying substrate.
Figure 8:
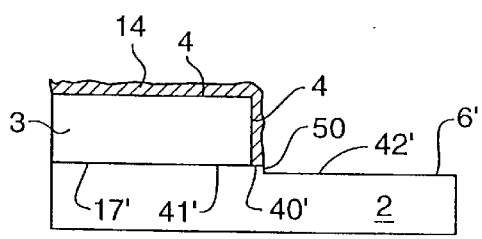
FIG. 8 depicts a further intermediate stage in the fabrication of the integrated circuit section of FIG. 7 which has been patterned using a conventional method of the prior art.

FIG. 7 depicts an intermediate stage of an integrated circuit section fabricated using a conventional method of the prior art in which a thin film 18 of solid material completely covers both first substrate surface 4 and second substrate surface 6 of substrate 8. This occurs, for example, when the solid-vapor surface tensions of both first substrate surface 4 and second substrate surface 6 are high enough, compared to the solid-liquid surface tensions between the liquid precursor and portions 4 and 6, to allow wetting of both portions 4 and 6 of substrate 8 and, thereby, formation of thin film 18. FIG. 8 shows the integrated circuit section of FIG. 7 after it has been patterned to remove the portion of thin film 18 covering surface 6 by using the methods of the prior art. In such patterning, to make certain that the portion of thin film 18 that covers surface 6 is entirely removed, it is necessary to also remove at least a small portion of surface 6, resulting in a stepped surface 6'. That is, in the prior art, whenever it is necessary to entirely remove a portion of an overlying layer from a surface, such as surface 6, it is also necessary to remove a portion of the underlying surface 6. Therefore the first portion 41' of surface 17' is not level with the second portion 42' of surface 17'. That is, the surface 17' is not continuously flat and level on either side of and through the junction region 40'. It is a feature of the invention that steps, such as step 50, do not occur in surfaces, such as surface 6', in which a portion, such as surface 19, of an overlying layer 18, has been removed.

It has been observed that misted deposition of metal organic liquid precursors and subsequent formation of thin films of layered superlattice materials or $ABO_3$-type perovskites is readily accomplished on sputter-deposited platinum electrodes and spin-on $SiO_2$ glass. Misted deposition of the same metal oxide thin films is not possible, however, on thermally-oxidized $SiO_2$. This difference is likely due to the different surface structures that result from the two processes. The difference can also be discussed in terms of stresses. It is known that thermally-oxidized silicon oxide possesses compressive stress, whereas spun-on silicon dioxide and other glasses possess tensile stress. It is believed that the phenomenon of selective deposition of metal oxides on substrates including thermally-oxidized glass is a result of differences in the relative values of $\gamma_{sv}$ and $\gamma_{sl}$ in thermally-oxidized glass and spun-on glass. It is believed that the compressive stress in thermally-oxidized glass increases the solid-liquid surface tension, $\gamma_{sl}$, relative to the solid-vapor surface tension, $\gamma_{sv}$, making the thermally-oxidized glass less prone to wetting by the liquid precursor. As liquid mist particle size approaches very small sizes, on the order of one micron in diameter or less, particles are prone to stick to some surfaces, while bouncing off others. For example, a liquid precursor mist particle with a diameter of one micron is likely to stick to a layer of sputtered platinum, but is likely to bounce off a surface of thermally oxidized silicon oxide.

Figure 9:
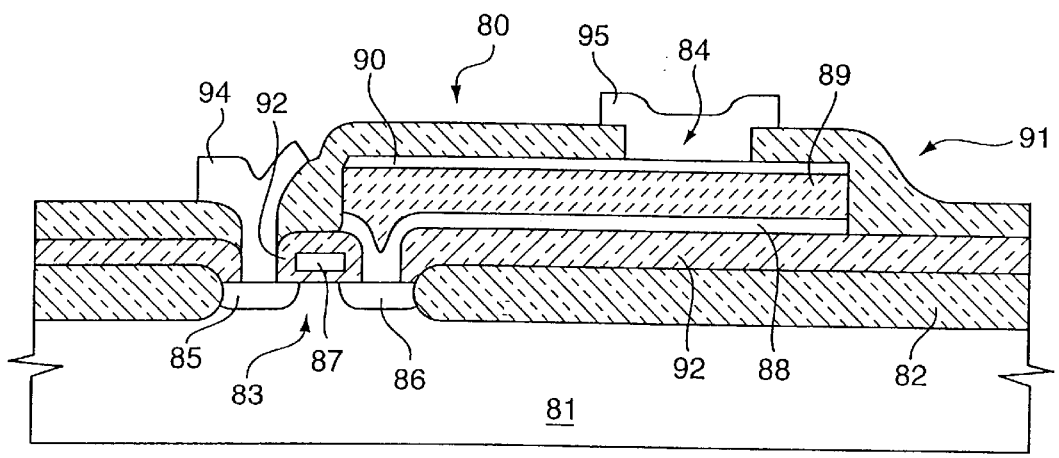
FIG. 9 depicts a cross-sectional view of an exemplary dynamic random access memory ("DRAM") or nonvolatile ferroelectric random access memory ("FeRAM") cell fabricated according to the method of the invention.

In FIG. 9, there is shown a cross-sectional view of an exemplary dynamic random access memory ("DRAM") or nonvolatile ferroelectric random access 08/038 0 ("FeRAM") memory cell 80 that could be fabricated according to the method of the invention. The general manufacturing steps for fabricating integrated circuits containing MOSFETs and memory capacitor elements is described in Yoshimori, U.S. Pat. No. 5,561,307, which is hereby incorporated by reference as if completely contained herein. General fabrication methods have been described in other references also. Therefore, the elements of the circuit of FIG. 9 will be simply identified here.

In FIG. 9, the memory cell 80 is formed on a semiconductor substrate 81, typically comprising silicon, having field oxide areas 82, and two electrically interconnected electrical devices, a transistor 83, and a capacitor 84. Transistor 83 includes a source 85, a drain 86, and a gate 87. Capacitor 84 includes first electrode 88, dielectric thin film layer 89, and second electrode 90. Insulators, such as ILD 92, separate the devices 83 and 84, except where drain 86 of transistor 83 is connected to first electrode 88 of capacitor 84. First electrode 88 is shown as a single element because of the scale of the drawing, though it should be understood that it will usually comprise two or more different layers, such as a titanium sublayer and a platinum sublayer. As is known in the art, the titanium assists in adhering the platinum sublayer to an underlying layer, such as ILD 92. Electrical contacts, such as 94 and 95, make electrical connection to devices 83 and 84 and to other parts of integrated circuit 91.

In embodiments of the inventive method, as explained with the aid of FIG. 9, dielectric thin film 89 is formed by selective deposition. Selective deposition of dielectric thin film 89 is achieved by selecting both the solid-liquid surface tension, $\gamma_{sl,92}$, between ILD 92 and the liquid precursor of thin film 89, and the solid-vapor surface tension, $\gamma_{sv,92}$, between ILD 92 and the ambient vapor of the deposition process. The composition of the liquid precursor and ILD 92 are chosen so that $\gamma_{sl,92}$ is relatively high with respect to $\gamma_{sv,92}$, thereby making ILD 92 less prone to wetting, while first electrode 88 is well wetted by the liquid precursor. First electrode 88 comprises an electrically conductive material, such as Pt, Ir, Ru, Pd, W, TiW, WSi, MoSi, TaN, AlTiN, TiN or a silicide, and preferably having tensile stress to promote wetting. ILD 92 typically comprises a silicon-containing oxide, such as $SiO_2$, SiN, SiON or SiOF, having compressive stress to inhibit wetting.

Preferably, the selective deposition of the invention is achieved using a misted deposition process. In a misted deposition process, a precursor liquid for a solid material is prepared, a mist is generated from the liquid, and the mist is flowed through a deposition chamber where it is deposited on a substrate to form a liquid coating of the mist on the substrate. The coating and substrate are then treated by such processes as UV curing, evaporation in a vacuum, and baking, and then annealed to form a layer of the desired solid material. Basic misted deposition apparati and processes are described in detail in U.S. Pat. No. 5,456,945, issued Oct. 10, 1995, and in U.S. Pat. No. 5,759,923, issued Jun. 2, 1998, as well as in numerous other publications, so they will not be described in detail herein.

As is conventional in the art, in this disclosure the term "substrate" is used in a general sense where it includes one or a number of layers of material, such as layers 2 and 3 in FIGS. 1–6, on which the layer of solid material may be deposited;

and also in a particular sense in which it refers to a wafer substrate 81, generally formed of silicon, gallium arsenide, glass, ruby or other material known in the art, on which the other layers are formed. Unless otherwise indicated in this specification, it means any object on which a layer of a thin film material is deposited using the method of the invention.

Terms of orientation, such as "above", "top", "over", "upper", "below", "bottom", and "lower" herein, mean relative to the semiconductor substrate 81 in FIG. 9. That is, if a second element is "above" or "over" a first element, it means it is farther from substrate 81; and if it is "below" another element, then it is closer to substrate 81 than the other element. Description of the position of one element in relation to another element using one of the above terms does not indicate or imply that the elements are in physical contact with each other. Description of a first element with respect to a second element using the term "directly", such as the first element being "directly on" or "directly under" the second element, indicates that the elements are in physical contact. The long dimension of substrate 81 defines a plane that is considered to be a "horizontal" plane herein, and directions perpendicular to this plane are considered to be "vertical".

The term "thin film" herein means a thin film of a thickness appropriate to be used in an integrated circuit. Such thin films are less than 1 micron in thickness, and generally are in the range of 20 nm to 500 nm. It is important to distinguish this term from the same term, i.e. "thin film", as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

The term "mist" as used herein is defined as fine droplets or particles of a liquid and/or solid carried by a gas. The term "mist" includes an aerosol, which is generally defined as a colloidal suspension of solid or liquid particles in a gas. The term "mist" also includes a fog, as well as other nebulized suspensions of the precursor liquid in a gas. Since the above terms and other terms that apply to suspensions in a gas have arisen from popular usage, the definitions are not precise, overlap, and may be used differently by different authors. For example, "vapor", when used in its technical sense, means an entirely gasified substance, and in this sense would not be included in the definition of "mist" herein. However, "vapor" is sometimes used in a nontechnical sense to mean a fog, and in this case would be included in the definition of "mist" herein. The term "mist" as used herein is intended to be broader than the term "aerosol", and includes liquid suspensions that may not be included under the terms "aerosol", "vapor", or "fog".

The term "electrical" herein, when referring to either the "electrical acceleration" or the "electrical charging" of the mist particles is intended to include such aspects based on either electrostatic or electromagnetic principles or both.

Figure 10:
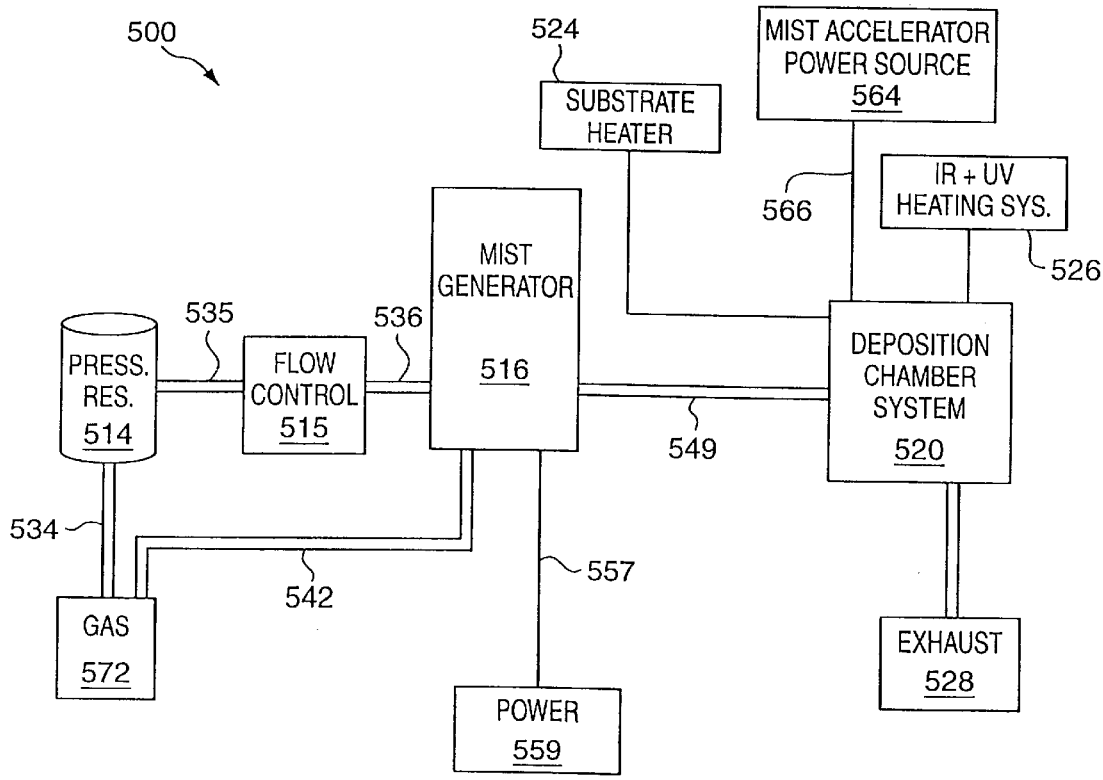
FIG. 10 depicts a block diagram of a generalized misted deposition apparatus for fabricating a thin film of solid material in accordance with the invention.

FIG. 10 depicts a block diagram of a generalized misted deposition apparatus 500 for forming a thin film of solid material in an integrated circuit in accordance with the preferred method of the invention. The apparatus 500 includes: a source of a liquid precursor, that is, pressurized reservoir 514; a gas system 572; a volumetric flowrate controller 515; a mist generator 516; a deposition chamber system 520; a substrate heater 524; an ultraviolet and infrared heating system 526; a mist accelerator 564; and an exhaust system 528.

A precursor liquid for a material, such as a glasseous ILD layer or a metal oxide dielectric layer, is prepared, a mist is generated from the precursor liquid, and the mist is flowed through a deposition chamber where it is deposited on a substrate to form a liquid coating on the substrate. The liquid coating and substrate are then treated by UV curing, evaporation in a vacuum, and/or baking, and then annealed to form a layer of the desired solid material.

Figure 11:
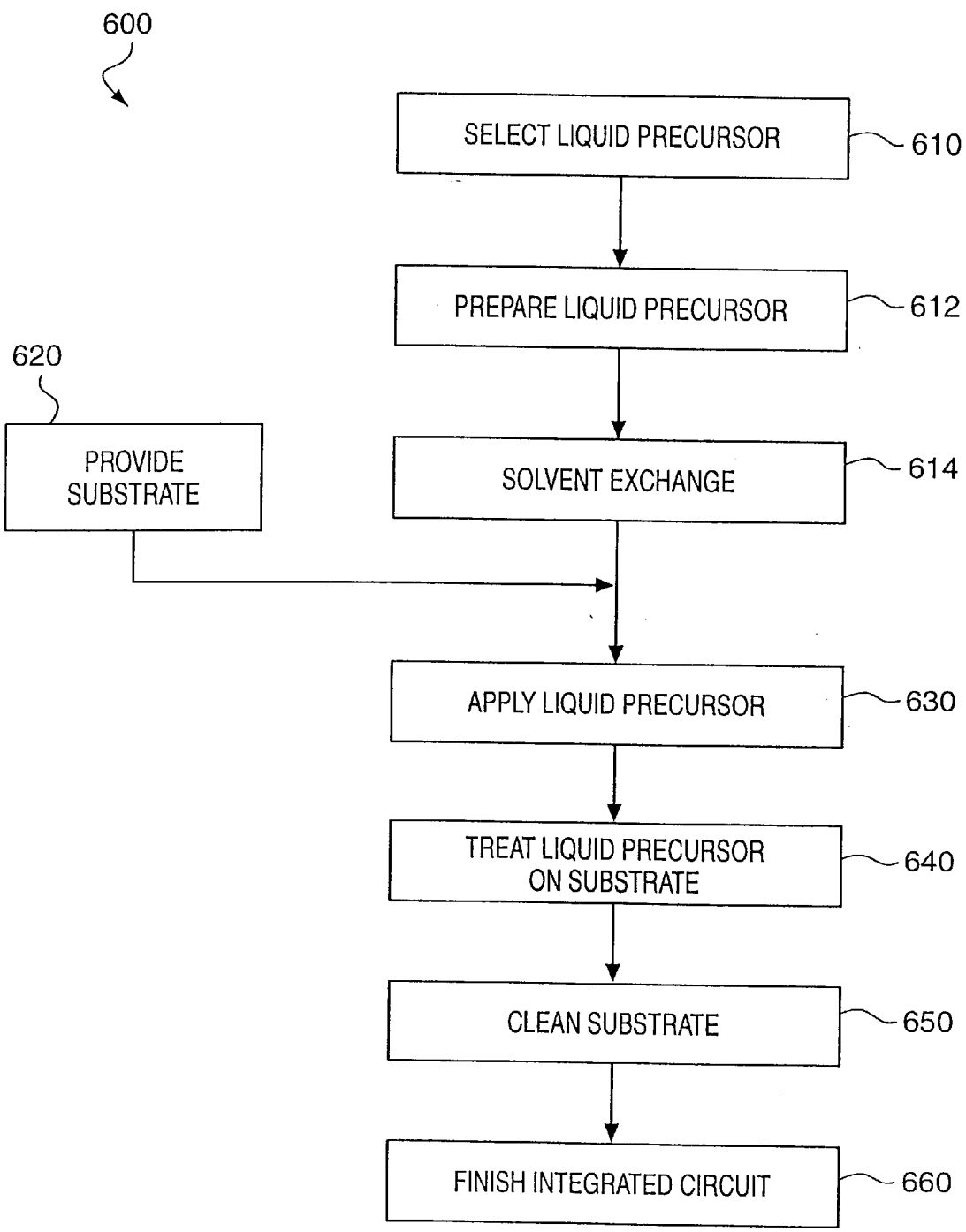
FIG. 11 is a schematic flowsheet of a generalized method for fabricating a thin film of solid material in accordance with the invention.

In FIG. 11, there is shown an exemplary flow chart depicting the fabrication of a layered superlattice material thin film according to the preferred method of the invention. The precursor liquid solution is preferably obtained by preparing precursors for each element using alkoxide chemistry, carboxylic acid chemistry, or other wet chemistry techniques, which lead to a common solvent. The solution having that common solvent is preferably used as the sole source for the entire deposition process. However, the invention also contemplates using multiple precursor sources in parallel. In particular, other sources may be used in parallel for doping or modifying the final desired solid material or the liquid precursor.

In accordance with the invention, in selection step 610, the composition of the liquid precursor is designed so that the values of relative solid-liquid surface tension, $\gamma_{sl}$, and solid-vapor surface tension, $\gamma_{sv}$, of the various substrate surfaces under operating conditions of the deposition method will result in selective deposition of a thin film of solid material upon treating the liquid precursor.

For solid materials comprising metal oxide compounds, precursor liquids generally include a metal compound in a solvent, such as sol-gel precursor formulations, which typically comprise metal-alkoxides in an alcohol solvent or metalorganic precursor formulations, sometimes referred to as MOD formulations, which in general comprise a metal-carboxylate formed by reacting a carboxylic acid, such as 2-ethylhexanoic acid, with a metal or metal compound in a solvent, or combinations thereof, as well as many other precursor formulations. The metal precursor compounds typically comprise metal 2-ethylhexanoates and metal 2-methoxyethoxides. Solvents are typically selected from among the alcohols, aromatic hydrocarbons, and esters. The preferred solvents include methyl ethyl ketone, isopropanol, methanol, tetrahydrofuran, xylene, n-butyl acetate, hexamethyl-disilazane (HMDS), octane, 1,4-dioxane, 2-methoxyethanol, and ethanol. HMDS and dioxane have been found to be particularly sensitive with respect to whether or not they will wet a particular material, and thus are particularly good candidates for solvents. An initiator, such as methyl ethyl ketone (MEK), may be added just before misting. A more complete list of solvents and initiators, as well as specific examples of metal compounds, are included in U.S. Pat. No. 5,614,252, issued Mar. 25, 1997.

The preparation of precursors in step 620 is preferably performed by mixing the metal or other metal compound, such as a metal alkoxide, with the carboxylic acid and the solvent and stirring. Low heat of between about 70° C. and 90° C. may be added to assist the reaction and dissolving, but this is generally not necessary. Generally, the initial precursors for all metals will be prepared in the same container; that is, the first metal or metal compound, the first measure of carboxylic acid, and a first solvent are placed in a container; the metal or metal compound and carboxylic acid are reacted; and the reactant dissolved; the second metal or metal compound is then placed in the same container and additional carboxylic acid and solvent are added and stirred to react the second metal or metal alkoxide and dissolve the reactant; then the third metal or metal compound, third carboxylic acid, and third solvent are added, the metal or metal compound is reacted, and the reactant dissolved. In this process, the most reactive metal or metal compound is preferably added first, the second most reactive metal or metal compound added second, and the least reactive metal or metal compound added last. It also may be desirable to perform a distillation step after each or some of the metal and/or metal compounds are reacted and dissolved. Alternatively, each metal and/or metal compound may be combined with a carboxylic acid and solvent, reacted, and dissolved in a separate container, the result distilled if desirable, and then the three separate solutions mixed in step 612. Variations and combinations of preparing the individual metal precursors separately or in the same container with or without distillation(s) may be used depending on the solvents used and the form in which a metal element is readily available. It is understood that a commercially prepared precursor may be used, provided it can be modified to achieve selected surface tension properties. In addition, many other processes for preparing the initial precursor may be used, as, for example, the variations discussed in U.S. Pat. No. 5,468,679 issued Nov. 21, 1995.

When the solution of reacted and dissolved metal carboxylates has been prepared, the precursor solution is then mixed and distilled by heating and stirring the solution to further the reaction of the reagents, reduce the solution to the desired composition and viscosity, which may depend on whether the solution is to be stored or used immediately, and/or to remove certain liquids, such as water. Generally, if it is desirable to remove certain liquids, the solution is heated to a temperature above the boiling point of the liquids to be removed and below the boiling point of the liquids that are desired to be retained. The solution is distilled until all the solvents that are desired to be removed have evaporated and a desired composition and viscosity are reached. It may be necessary to add the desired solvent several times in the distilling process to remove all undesired solvents and obtain the desired composition and viscosity. Preferably, as much water as possible is distilled out so that the resulting initial precursor is essentially anhydrous.

Optionally, either separately or in combination with step 612, a solvent exchange step 614 may be performed. In this step, a solvent, such as xylene, is added and the other solvents are distilled away. This solvent exchange step may be performed as the final step in preparation of the precursor prior to storing to change to a solvent that stores well, and/or just before the application step 630 to change to a solvent that will selectively deposit on one substrate surface 4 and not on another 6, or both. If it is known that a certain solvent, such as xylene, will be preferable, the solvent may be added with the other solvents in step 612. Prior to the preferred misted deposition process to apply the liquid precursor in step 630, an initiator may be added to the precursor. An initiator is a high vapor pressure, low boiling point, solvent that assists in initiating the formation of the mist. Preferably, the metal moieties in the precursor are also soluble in the initiator; that is, the initiator is a solvent for the metal moieties. A liquid with a boiling point of between about 50° C. and 100° C. is preferred as an initiator.

Examples of the preparation of layered superlattice precursor solutions are given in U.S. Pat. No. 5,423,285 issued Jun. 13, 1995. Precursors for layered superlattice materials made by the processes described above are now commercially available from Kujundo Chemical Laboratory Co. Ltd. (KJC), No. 1–28 5 Chome, Chiyoda, Sakado-shi, Saitama pref., Japan.

In step 620 of the preferred process, a substrate is first prepared for deposition by pretreatment. Here, "pretreatment" preferably comprises exposure to UV radiation, but may also include exposure to infrared radiation, a bake at a temperature between 150° C. and 900° C., and/or exposure to vacuum. In the preferred embodiment of the invention, the substrate comprises at least two surfaces. Preferably, the first surface is easily wetted by the mist particles of liquid precursor, while the second surface is nonwetting. In a preferred embodiment, the first surface is electrically conductive, and the second is electrically nonconductive or insulating. In any case, at least one physical property of one surface is different from the corresponding physical property of the other surface such that application of the liquid precursor followed by treatment of the precursor on the substrate results in a solid thin film of desired material on the first surface, but not on the second surface.

In step 630, the liquid precursor is applied to the substrate, preferably by a misted deposition process, although other liquid deposition processes, such as a spin-on process, may be used. The flow of the precursor liquid through the misted deposition system is briefly described here with the aid of FIG. 10. To begin the process, the precursor liquid is inserted in pressurized reservoir 514 while the deposition chamber system 520 is being pumped down to a partial vacuum of about 70 Torr below atmospheric pressure. Gas system 572 provides pressurized gas, preferably dry nitrogen or other inert gas, via line 534 to precursor reservoir 514 at sufficient pressure to drive the fluid from reservoir 514 through volumetric flowrate controller 515. Pressurized precursor reservoir 514 is connected to volumetric flowrate controller 515 via line 535, and volumetric flowrate controller 515 is connected to mist generator 516 via line 536. Volumetric flowrate controller 515 is an electronic device that accurately passes a selected volume of liquid. Unlike a valve, the flow of liquid through a volumetric flowrate controller does not depend on the pressure of the fluid flow line, the viscosity of the liquid, or the numerous other parameters that can affect fluid flow. The volumetric flowrate controller 515 is capable of accurately controlling flow of a liquid to within 2% of the selected flow rate. Preferably, volumetric flowrate controller 515 is a controller model No. LV410 manufactured by ESTEC (a Japanese Corporation) and distributed in the USA by Horiba Instruments, Inc. of San Jose, Calif. This volumetric flowrate controller 515 can control the flow of precursor into mist generator 516 from about 0.05 ccm up to about 1 ccm. The precursor liquid moves through inlet tube 536 to mist generator 516. Mist generator 516 may use one of several methods suitable for generating mists from liquids; for example, ultrasonic misting and venturi misting. Preferably, a venturi mist generator is used. Pressurized gas flows through gas line 542 to mist generator 516, with the gas pressure in line 542 automatically controlled. Preferably, this pressure is between 40 pounds per square inch (psi) ($2.76 \times 10^5$ Pa) and 80 psi ($5.52 \times 10^5$ Pa), and most preferably about 60 psi ($4.14 \times 10^5$ Pa). The particle size range of the mist droplets is selected such that the droplets will more readily stick to the first, conductive surface than to the second, nonconductive surface. A power line 557 runs to mist generator 516 to charge the mist. The voltage applied in mist generator 516 is automatically controlled by power generator 559. Preferably, the gas is a mixture of an inert gas, such as dry nitrogen, and an easily ionized gas, preferably oxygen or carbon dioxide, and most preferably oxygen. The oxygen is added to enhance the charging of the mist. The oxygen ionizes readily, and assists in transferring charge to the liquid mist droplets since the gas particles in a gas at room temperature are continually colliding. Typically, the gas is 1% to 15% oxygen in volume. In the preferred embodiment process, 95% dry nitrogen and 5% oxygen is used. The mass flow of liquid droplets is selected to optimize the deposition rate onto the substrate. Generally, if the deposition rate is relatively slow, then mist droplets are more likely to deposit on the second surface and form an undesired solid film upon treatment of the deposited liquid precursor than if a faster deposition rate were used. If a faster deposition rate is used, then even if some liquid does deposit on the second, or nonwetting, surface, then it will be more easily cleaned off during a subsequent cleaning step than if a slow deposition rate were used.

To begin the deposition process, the mist generated in mist generator 516 flows into deposition chamber system 520 via conduit 549. The deposition takes place near atmospheric pressure. The pressure is automatically controlled. Preferably, the gas/mist flow through the system from line 549 through deposition chamber system 520 is between 3 liters per minute and 8 liters per minute, and preferably about 5 liters per minute.

The charged particles are accelerated in deposition chamber system 520 by means of a voltage applied from mist accelerator power source 564 via electrical cable 566. The acceleration voltage is automatically controlled. Additional oxygen or carbon dioxide may also be added if needed to assist in charging the mist. As described in U.S. patent application Ser. No. 08/971,799 filed Nov. 17, 1997, which is hereby incorporated by reference as though fully described herein, the substrate 10 is charged or grounded to form one plate of the accelerator. Since whether or not the charged mist particles stick to the substrate is highly sensitive to the relative charges between the substrate and the mist particles and also to particle size, and the electrical charge on the substrate depends on whether the substrate is a metal or an insulator, the charge and particle size are selected so that the mist sticks to one surface 4, but not to the other surface 6.

A substrate heater system 524 controls the temperature of the substrate, which is chosen for the particular deposition process. After the deposition is completed, the flow of mist to deposition chamber system 520 is stopped, and the liquid coating on the substrate is treated in step 640. The liquid coating on the substrate may be cured and baked in situ via ultraviolet and/or infrared lamps of heating system 526. By "in situ" is meant that the substrate is not removed from the deposition chamber during this process. Preferably, the initial drying step takes place without breaking vacuum. This is important, because the electronic quality of the deposited layer of solid material is compromised by breaking vacuum and exposing the liquid coating to contaminants prior to drying. The substrate may also be removed from the deposition chamber and transferred to an annealing station without breaking vacuum. The treating step 640 may include one or more processes selected from: exposing to vacuum, exposing to ultraviolet radiation, electrical poling, drying, heating, baking, rapid thermal processing, and annealing.

After the solid thin film of desired material is formed by treating step 640, the substrate is cleaned in step 650. The cleaning is conducted using deionized water or commercial solvents in a conventional cleaning or washing process of the integrated circuit art. The cleaning step 650 serves to remove any residue of precursor and solid from surfaces of the substrate where it is not desired; for example, from the second substrate surface 6 of FIGS. 3–6, and from ILD 92 of FIG. 9. At the same time, cleaning and washing processes of step 650 do not remove the thin film of solid material from where it is desired; for example, from first substrate surface 4 of FIGS. 2–6 or from first electrode 88 of FIG. 9. Finally, in step 660, the integrated circuit is completed, which typically comprises deposition of additional layers using various methods of the art, patterning and etching processes, and packaging.

There has been described a novel method of fabricating integrated circuit devices by selectively depositing a thin film of solid material on an integrated circuit substrate. The novel method is useful for fabricating layers of essentially any type of solid material used in integrated circuits that is capable of being formed from a liquid precursor. The novel method can be used to form, among others, gate dielectric in MOSFETs, interlayer dielectric layers, silicon dioxide insulators, and capacitor dielectric in DRAMs and FeRAMs. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that the advantageous use of selectively choosing relative surface tension values of solid substrates and liquid precursors to effect selective deposition of solid material in integrated circuit fabrication has been disclosed, the method can be advantageously used utilizing physical properties other than surface tension and in integrated circuit applications other than those described. Other liquid deposition processes, different from those described above, may be used to form layers of solid material. It is clear from the above that various formulations may be used. Further, the precursors, processes and structures can be combined with conventional processes to provide variations on the processes and devices described. It is also evident that the process steps recited may, in some instances, be performed in a different order, or equivalent structures and processes may be substituted for the various structures and processes described. Consequently, the invention is to be construed as embracing each and every novel feature and novel combination of features present in and/or possessed by the precursors, precursor formation processes, electronic devices, and electronic device manufacturing methods described.

What is claimed is:

1. A method of fabricating a thin film of solid material in an integrated circuit, comprising steps of:

providing a substrate having a first substrate surface and a second substrate surface, said first substrate surface having at least one physical property that is different than the corresponding physical property of said second substrate surface;

selecting a precursor liquid and a precursor liquid deposition process such that applying said precursor liquid to said first and second substrate surfaces using said liquid deposition process will form a solid thin film on said first substrate surface upon treating of said liquid precursor and will not form a solid thin film on said second substrate surface upon treating of said liquid precursor:

applying a thin film of said precursor liquid to said substrate using said liquid deposition process to coat said substrate; and treating said coating on said substrate to form said thin film of solid material on said first substrate surface;

wherein said first and second substrate surfaces become part of said integrated circuit.

2. A method as in claim 1 and further including the step of cleaning said substrate to remove residues from said second substrate surface without removing said thin film of solid material from said second substrate surface.

3. A method as in claim 2 wherein said step of cleaning comprises washing said second substrate surface.

4. A method as in claim 1 wherein said step of selecting a precursor liquid comprises selecting a precursor liquid that will more readily wet said first surface than said second surface.

5. A method as in claim 1 wherein said step of selecting a precursor liquid comprises selecting a precursor liquid including a solvent selected from the group consisting of HMDS and dioxane.

6. A method as in claim 1 wherein said step of selecting a precursor deposition process comprises selecting a process from the group comprising spin coating and misted deposition.

7. A method as in claim 6 wherein said step of selecting a precursor deposition process comprises selecting a misted deposition process and further includes the step of selecting a range of droplet sizes for the mist such that said droplets will more readily stick to said first surface than said second surface.

8. A method as in claim 6 wherein said step of selecting a precursor deposition process comprises selecting a misted deposition process and further includes the step of selecting a deposition rate such that a solid thin film will be formed on said first surface and a solid film will not be formed on said second surface.

9. A method as in claim 1 wherein said first surface comprises a conductive material and said second surface comprises an insulating material.

10. A method as in claim 9 wherein said conductive material is selected from the group consisting of platinum, iridium, ruthenium, palladum, tungsten, titanium tungsten, metal suicides, tantalum nitride, aluminum titanium nitride, and titanium nitride.

11. A method as in claim 9 wherein said insulating material is selected from the group consisting of silicon oxides, silicon nitrides, silicon oxynitrdes and silicon oxyfluorides.

12. A method as in claim 1 wherein said first surface comprises a material having tensile stress and said second surface comprises a material having compressive stress.

13. A method as in claim 1 wherein said step of treating comprises a process selected from the group consisting of: exposing to vacuum, exposing to ultraviolet radiation, electrical poling, drying, heating, baking, rapid thermal processing, and annealing.

14. A method of fabricating a thin film of solid material in an integrated circuit, comprising steps of:

providing a substrate having a first substrate surface and a second substrate surface, said first substrate surface being a surface on which a thin film of a solid material will tend to form upon application of a precursor liquid to said first substrate surface and treating of said precursor liquid, and said second substrate surface being a surface on which a thin film of a solid material will tend not to form upon application of said precursor liquid to said second substrate surface and said treating of said precursor liquid;

applying a thin film of said precursor liquid to said substrate; and treating said thin film of said precursor liquid on said substrate to form said thin film of solid material on said first substrate surface;

wherein said first and second substrate surfaces become part of said integrated circuit.

15. A method as in claim 14 and further including the step of cleaning said substrate to remove residues from said second substrate without removing said thin film of solid material from said first substrate.

16. A method as in claim 15 wherein said step of cleaning comprises washing said substrate.

17. A method as in claim 14 wherein said precursor liquid is selected from the group consisting of HMDS and dioxane.

18. A method as in claim 14 wherein said first surface comprises a conductive material and said second surface comprises an insulating material.

19. A method as in claim 18 wherein said conductive material is selected from the group consisting of platinum, iridium, ruthenium, palladum, tungsten, titanium tungsten, metal suicides, tantalum nitride, aluminum titanium nitride, and titanium nitride.

20. A method as in claim 18 wherein said insulating material is selected from the group consisting of silicon oxides, silicon nitrides, silicon oxynitrides and silicon oxyfluorides.

21. A method as in claim 14 wherein said first surface comprises a material having tensile stress and said second surface comprises a material having compressive stress.

22. A method as in claim 14 wherein said step of applying is selected from the group consisting of spin coating and misted deposition.

23. A method as in claim 14 wherein said step of treating comprises a process selected from the group consisting of: exposing to vacuum, exposing to ultraviolet radiation, electrical poling, drying, heating, baking, rapid thermal processing, and annealing.

24. A method of fabricating a thin film of solid material in an integrated circuit, comprising steps of:

providing a substrate having a substrate surface, said substrate surface having a wetting portion and a non-wetting portion;

providing a precursor liquid for forming a liquid coating on said substrate surface such that said liquid coating will have a surface tension suitable for wetting said wetting portion and unsuitable for wetting said non-wetting portion;

applying a thin film of said precursor liquid to said substrate surface to form said liquid coating; and treating said liquid coating on said substrate surface to form said thin film of solid material on said wetting portion;

wherein said wetting portion and said nonwetting portion become part of said integrated circuit.

25. A method as in claim 24 wherein said thin film of solid material comprises a metal oxide.

26. A method as in claim 24 wherein said thin film of solid material comprises a layered superlattice material.

27. A method as in claim 24 wherein said thin film of solid material comprises silicon dioxide.

28. A method as in claim 24 wherein said thin film of solid material comprises a silicon glass.

29. A method as in claim 24 wherein said precursor liquid comprises a metal compound.

30. A method as in claim 29 wherein said metal compound is selected from the group consisting of metal 2-ethylhexanoates and metal 2-methoxyethoxides.

31. A method as in claim 24 wherein said precursor liquid comprises a solvent selected from the group consisting of alcohols, aromatic hydrocarbons, and esters.

32. A method as in claim 24 wherein said solvent is selected from the group consisting of xylenes, 2-methoxyethanol, n-butyl acetate, 1,4-dioxane, methanol and methyl ethyl ketone.

33. A method as in claim 24 wherein said step of treating comprises a process selected from the group consisting of: exposing to vacuum, exposing to ultraviolet radiation, electrical poling, drying, heating, baking, rapid thermal processing, and annealing.

34. A method as in claim 24, further comprising a step of washing said substrate surface to remove undesired material from said nonwetting portion.

35. A method as in claim 24 wherein said step of applying comprises spin-coating a liquid coating of said precursor on said substrate.

36. A method as in claim 24 wherein said step of providing a substrate comprises placing a substrate inside an enclosed deposition chamber, and said step of applying comprises the steps of: producing a mist of said precursor liquid, and flowing said mist through said deposition chamber to form said liquid coating of said precursor liquid on said substrate surface.

* * * * *